(12) United States Patent
Best et al.

(10) Patent No.: US 11,272,634 B2
(45) Date of Patent: Mar. 8, 2022

(54) MODULAR SYSTEM FOR PRODUCING AN ELECTRONIC DEVICE

(71) Applicant: Phoenix Contact GmbH & Co. KG, Blomberg (DE)

(72) Inventors: Frank Best, Bueckeburg (DE); Volker Schulze, Blomberg (DE); Helmut Eusterholz, Paderborn (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 16/769,246

(22) PCT Filed: Dec. 4, 2018

(86) PCT No.: PCT/EP2018/083525
§ 371 (c)(1),
(2) Date: Jun. 3, 2020

(87) PCT Pub. No.: WO2019/110604
PCT Pub. Date: Jun. 13, 2019

(65) Prior Publication Data
US 2021/0195783 A1    Jun. 24, 2021

(30) Foreign Application Priority Data

Dec. 8, 2017 (BE) .................................. 2017/5919
Dec. 8, 2017 (DE) ..................... 10 2017 129 251.9

(51) Int. Cl.
*H05K 1/14* (2006.01)
*H05K 7/14* (2006.01)
(Continued)

(52) U.S. Cl.
CPC ......... *H05K 7/1427* (2013.01); *H05K 5/0204* (2013.01); *H05K 7/1402* (2013.01); *H05K 7/1418* (2013.01); *G06F 1/181* (2013.01)

(58) Field of Classification Search
USPC ........................................................ 361/740
See application file for complete search history.

(56) References Cited

U.S. PATENT DOCUMENTS 5,129,842 A * 7/1992 Morgan ................. H01R 13/73
                                                          439/532
7,068,516 B2 * 6/2006 Chan .................... H05K 5/0008
                                                          361/731
(Continued)

FOREIGN PATENT DOCUMENTS

DE     8805257 U1    6/1988
DE     9408294 U1    7/1994
(Continued)

*Primary Examiner* — Hung S. Bui
(74) *Attorney, Agent, or Firm* — Leydig, Voit & Mayer, Ltd.

(57) ABSTRACT

A modular system for producing an electronic device includes: a housing, which forms an accommodating space; a printed circuit board which is insertable along an insertion direction into the accommodating space of the housing and, in a mounting position, is accommodated in the accommodating space; and a plurality of attachment parts, which are connectable to the printed circuit board and which, when viewed along the insertion direction, each have a division corresponding to a predetermined smallest dividing unit or an integral multiple of the predetermined smallest dividing unit. Each attachment part has a first guide device for guiding on a second guide device of the housing and a combination of attachment parts is connectable to the printed circuit board in a manner arranged next to one another along the insertion direction such that when the printed circuit board is inserted into the accommodating space, the combination is guided.

17 Claims, 9 Drawing Sheets

(51) Int. Cl.
*H05K 5/02* (2006.01)
*G06F 1/18* (2006.01)

(56) References Cited

U.S. PATENT DOCUMENTS

| | | | |
|---|---|---|---|
| 7,495,931 B2* | 2/2009 | Clark | H05K 7/1425 |
| | | | 361/790 |
| 7,817,412 B2* | 10/2010 | Sullivan | G06F 1/16 |
| | | | 361/679.33 |
| 8,506,324 B2* | 8/2013 | Naufel | H01R 12/7082 |
| | | | 439/541.5 |
| 2009/0207571 A1 | 8/2009 | Boensch et al. | |
| 2011/0299246 A1 | 12/2011 | Brokmann et al. | |
| 2017/0257959 A1 | 9/2017 | Ogitani | |

FOREIGN PATENT DOCUMENTS

| | | |
|---|---|---|
| DE | 4428687 C1 | 8/1995 |
| DE | 202008002113 U1 | 6/2009 |
| DE | 102014104368 A1 | 10/2015 |
| EP | 2399435 B1 | 4/2015 |

\* cited by examiner

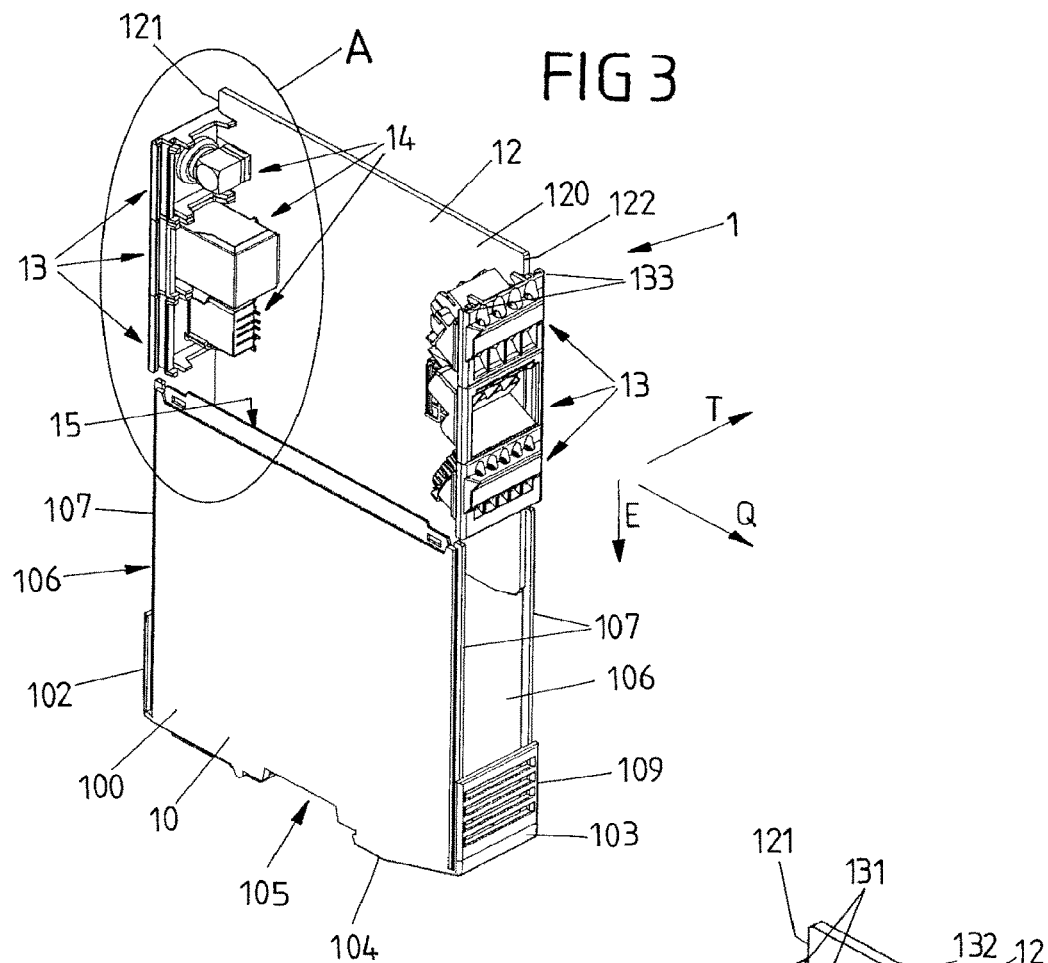
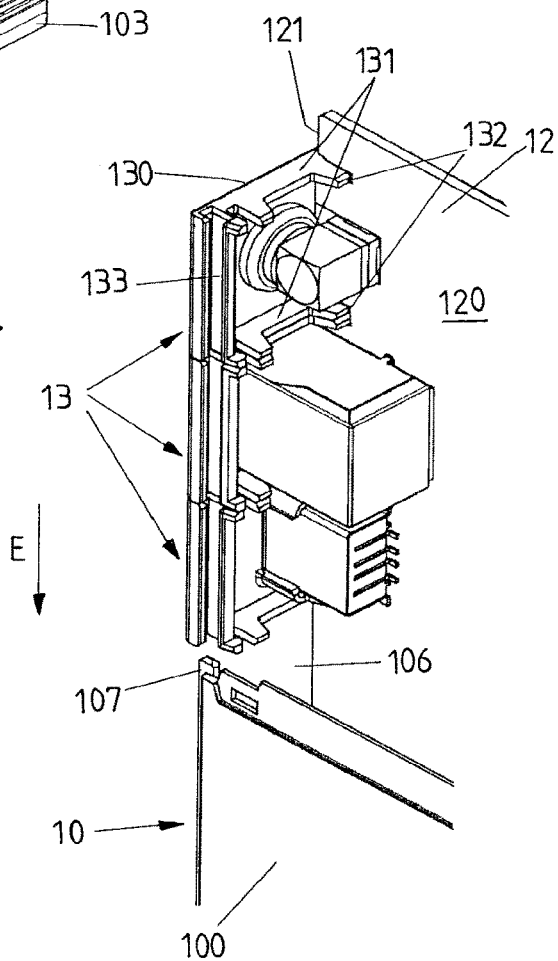

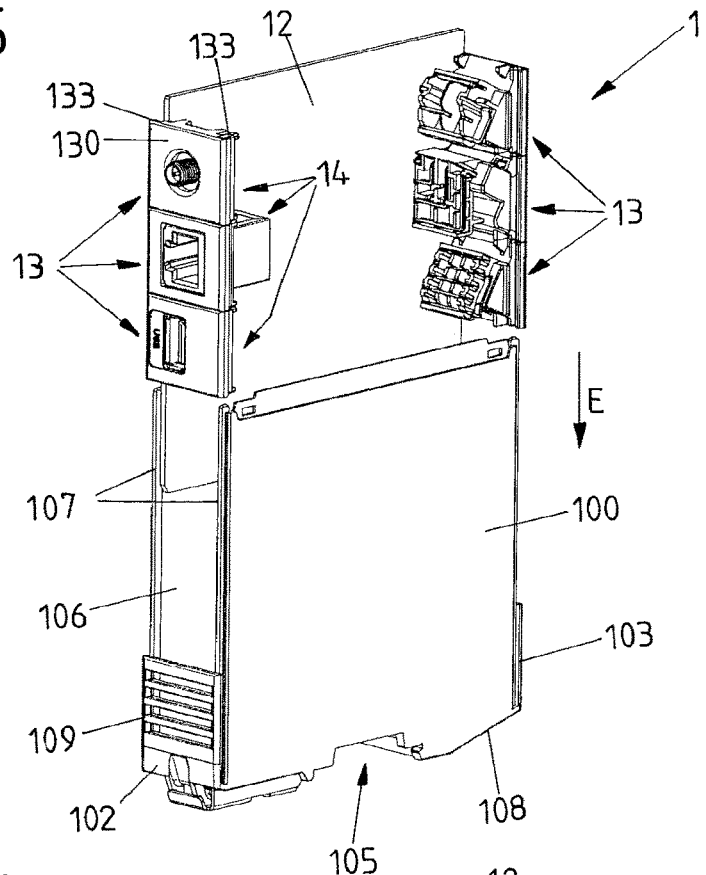
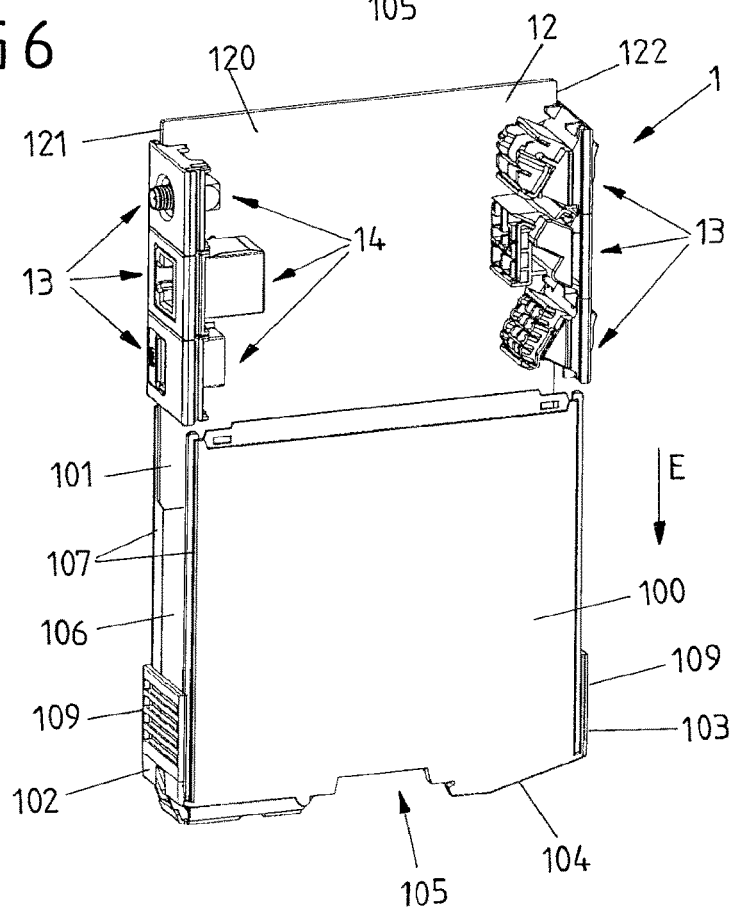

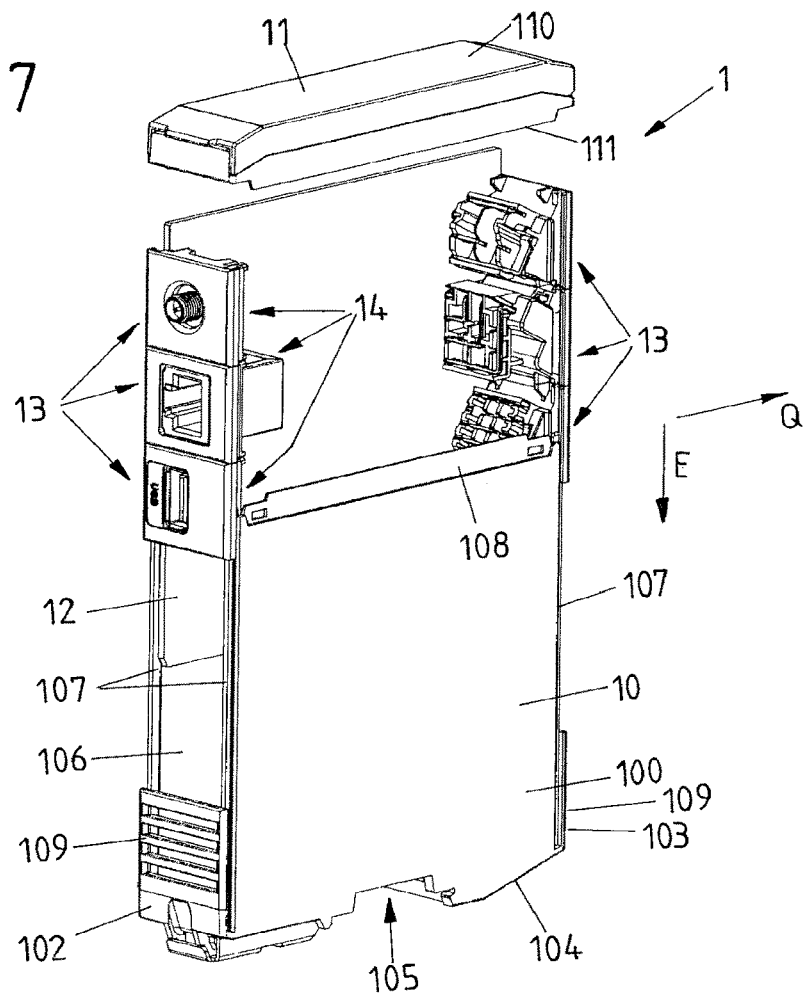
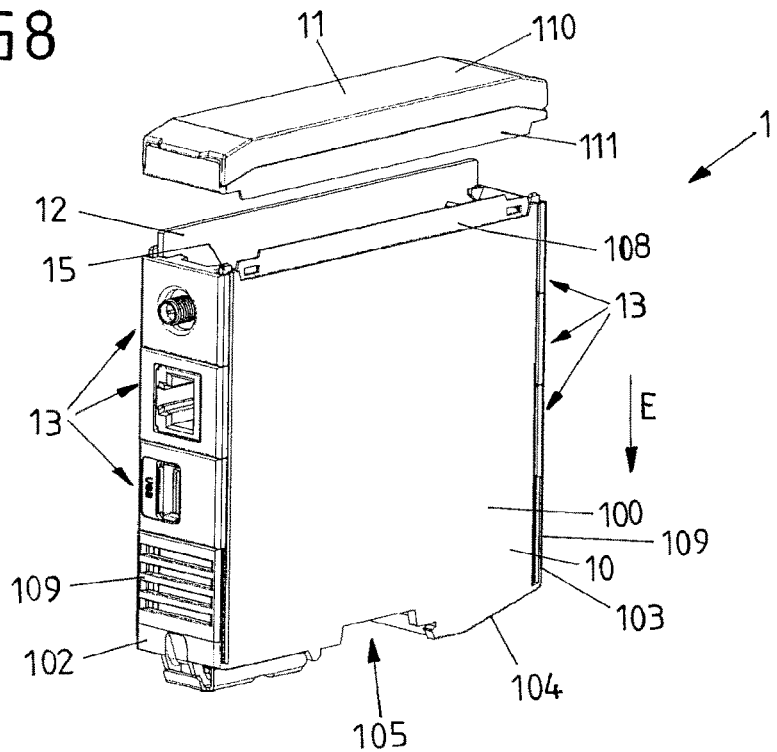

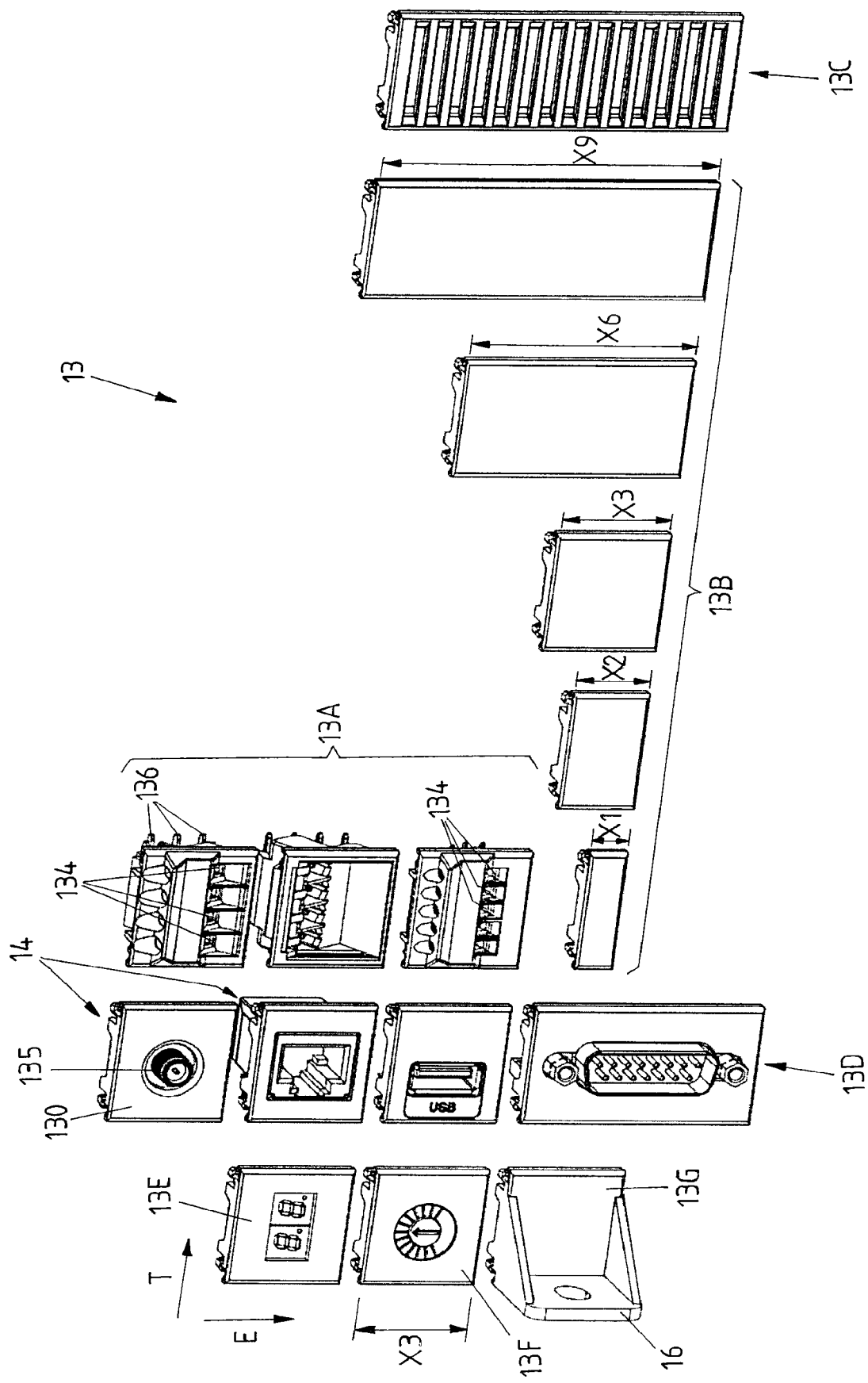

MODULAR SYSTEM FOR PRODUCING AN ELECTRONIC DEVICE

CROSS-REFERENCE TO PRIOR APPLICATIONS

This application is a U.S. National Phase application under 35 U.S.C. § 371 of International Application No. PCT/EP2018/083525, filed on Dec. 4, 2018, and claims benefit to Belgian Patent Application No. BE 2017/5919 filed on Dec. 8, 2017 and to German Patent Application No. DE 10 2017 129 251.9, filed on Dec. 8, 2017. The International Application was published in German on Jun. 13, 2019 as WO 2019/110604 under PCT Article 21(2).

FIELD

The invention relates to a modular system for producing an electronic device and to a method for producing an electronic device using a modular system.

BACKGROUND

Such a modular system for producing an electronic device comprises a housing, which forms an accommodating space, and a printed circuit board which can be inserted into the accommodating space of the housing along an insertion direction and, in a mounting position, is accommodated in the accommodating space.

Such an electronic device can, for example, be combined with other electronic devices along a junction direction, so that a plurality of electronic devices are arranged next to one another along the junction direction. The electronic device can, for example, be accommodated together with the other electronic devices on a support rail, so that, in this way, an electrical assembly is created which, for example, can assume control or evaluation functions within the framework of an industrial installation.

In this case, electronic components, which can be inserted into the housing in order to form the electronic device, are arranged on the printed circuit board. In the mounting position, the printed circuit board extends, for example, in parallel to side walls of the housing, between which the accommodating space is formed, and is enclosed in the housing in a protected manner.

What is desirable is an electronic device which can be mounted easily, in particular in order to insert and fix the printed circuit board in the housing, but can also be populated variably, for example with connections or other functional components, depending on the design of electronic components of the printed circuit board.

In an electronic device known from DE 44 28 687 C1, a printed circuit board, together with a housing part pre-assembled on operating elements of the printed circuit board, can be inserted into a housing. In the mounted position, the housing part closes an opening of the housing.

In an electronic device known from EP 2 399 435 B1, housings with connection chambers are pre-assembled on a printed circuit board. The printed circuit board can then be arranged together with side parts on a housing base in order to complete the electronic device.

SUMMARY

In an embodiment, the present invention provides a modular system for producing an electronic device, comprising: a housing, which forms an accommodating space; a printed circuit board which is insertable along an insertion direction into the accommodating space of the housing and, in a mounting position, is accommodated in the accommodating space; and a plurality of attachment parts, which are connectable to the printed circuit board and which, when viewed along the insertion direction, each have a division corresponding to a predetermined smallest dividing unit or an integral multiple of the predetermined smallest dividing unit, wherein each attachment part has a first guide device configured to guide on a second guide device of the housing and a combination of attachment parts is connectable to the printed circuit board in a manner arranged next to one another along the insertion direction such that when the printed circuit board is inserted into the accommodating space, the combination of attachment parts is guided in a displaceable manner by the first guide devices on the second guide device of the housing along the insertion direction.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 3 a view of the electronic device during assembly;

FIG. 4 an enlarged sectional view in detail A of FIG. 3;

FIG. 5 a view of the electronic device during assembly;

FIG. 6 another view of the electronic device during assembly;

FIG. 7 a view of the electronic device during the further assembly;

FIG. 8 a view of the electronic device prior to completion by a housing cover;

FIG. 9 a view of different exemplary embodiments of attachment parts of a modular system;

DETAILED DESCRIPTION

Figure 1:
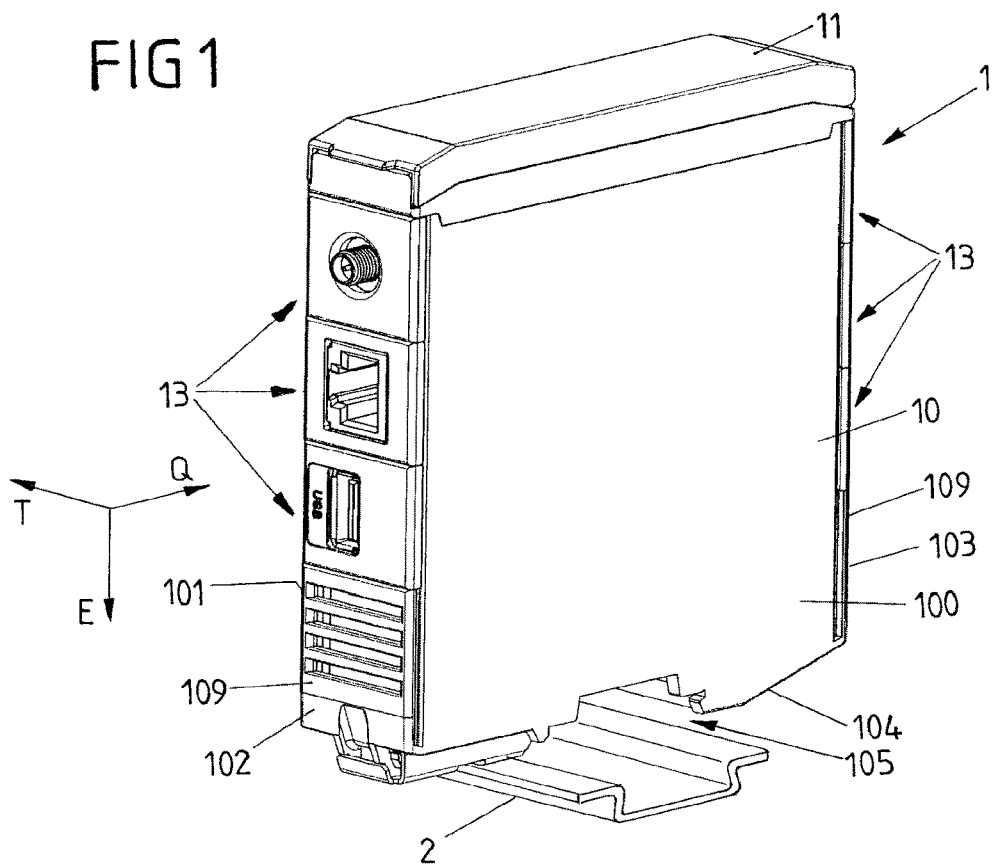
FIG. 1 a perspective view of an exemplary embodiment of an electronic device.

In an embodiment, the present invention provides a modular system and a method for producing, using a modular system, an electronic device which can be configured depending on the application, which system and method enable the simple and thus cost-effective assembly of the electronic device with the ability to variably populate, in particular with electrical and/or mechanical connections.

Accordingly, the modular system has a plurality of attachment parts which can be connected to the printed circuit board and which, when viewed along the insertion direction, each have a division corresponding to a predetermined smallest dividing unit or an integral multiple of the predetermined smallest dividing unit, wherein each attachment part has a first guide device for guiding on a second guide device of the housing and a combination of attachment parts can be connected to the printed circuit board in a manner arranged next to one another along the insertion direction such that, when the printed circuit board is inserted into the accommodating space, the combination of attachment parts is guided in a displaceable manner by means of the first guide devices on the second guide device of the housing along the insertion direction.

Within the framework of a modular system, a plurality of different attachment parts which can be variably combined with one another in different ways can thus be present. Given that the attachment parts have a division corresponding to a predetermined smallest dividing unit or an integral multiple of the predetermined smallest dividing unit, in principle, any desired combinations of attachment parts can be arranged next to one another along the insertion direction in such a way that the result is a combination of attachment parts with a predetermined total length corresponding, for example, to the length of a housing opening (measured along the insertion direction) to be closed by the attachment parts. A printed circuit board can thus be populated with quite different combinations of attachment parts, in order to be inserted together with the attachment parts into the accommodating space of the housing and thus to form the electronic device.

The use of different attachment parts in combination with one another makes it possible to provide different functions on the printed circuit board as explained below. Thus, this gives rise to a flexibly usable modular system, by means of which quite different electronic devices can be produced in a variable manner and configured in an application-specific manner. Thereby, the attachment parts can in particular provide a device interface from the printed circuit board construction stage of the manufactured electronic device to the outside.

The predetermined smallest dividing unit (in short: TE; English: unit) defines a basic length along the insertion direction. Some attachment parts can, for example, have a division corresponding to the single dividing unit. Other attachment parts can have a division corresponding to twice the dividing unit; i.e., they can be twice as long as the dividing unit. Yet other attachment parts can, for example, have a division corresponding to three times the dividing unit. Different attachment parts can thus be combined with one another along the insertion direction, in order to create a combination of attachment parts having a predetermined length. For example, if a housing opening into which the combination of attachment parts is to be inserted has a length corresponding to five times the dividing unit, attachment parts can be combined with one another in such a way that the resulting total length corresponds to five times the dividing unit.

In this case, each attachment part has (at least) one first guide device by means of which the attachment parts are guided on an associated second guide device of the housing, if the printed circuit board together with the combination of attachment parts arranged thereon is inserted into the accommodating space of the housing. The printed circuit board is thus inserted into the accommodating space of the housing in a manner guided by means of the attachment parts. In the mounting position, the printed circuit board is then preferably held in position in the accommodating space by means of the attachment parts.

In one embodiment, the housing has two side walls which are spaced apart from one another along a junction direction and form an accommodating space between them. The insertion direction is directed transversely to the junction direction. In the mounting position, the printed circuit board extends perpendicularly to the junction direction and is thus aligned in parallel to the side walls and in this way is accommodated in the accommodating space between the side walls.

A plurality of attachment parts can be combined with one another and, for the production of the electronic device, can be pre-assembled on the printed circuit board, in order to insert the printed circuit board together with the attachment parts arranged thereon into the housing. In the pre-assembled position, the attachment parts are connected to the printed circuit board in a manner that is firmly bonded (for example, by means of soldering), force-fitting or positive-locking, and thus together with the printed circuit board form a pre-assembled structural unit which can be attached to the housing of the electronic device.

This pre-assembled structural unit is attached in a guided manner in that first guide devices of the attachment parts are brought into engagement with second guide devices, for example on the side walls of the housing, so that the structural unit, i.e., the attachment parts together with the printed circuit board, can be inserted into the housing and the printed circuit board reaches a defined position within the accommodating space. In this case, each attachment part can have two first guide devices extending in parallel to one another along the insertion direction, while the side walls each have a second guide device extending along the insertion direction.

In the mounting position, the attachment parts then fix the printed circuit board in the accommodating space in that the printed circuit board is connected to the side walls by means of the attachment parts. Here, the attachment parts extend between the side walls and connect the side walls to one another in a positive-locking manner, so that the housing is completed and the attachment parts, for example, close the housing to the outside.

Any desired attachment parts for providing quite different functions can be attached to the printed circuit board. Depending on a desired configuration and function of the electronic assembly provided by the printed circuit board, the printed circuit board can thus be populated with different attachment parts, in order to insert the pre-assembled structural unit created in this way into the housing and thereby mount the electronic device.

For mounting, the first guide devices of the combination of attachment parts arranged on the printed circuit board and the second guide devices of the side walls of the housing can preferably be brought into engagement with one another in such a way that the attachment parts are firmly connected to the side walls in a plane extending perpendicularly to the insertion direction, but are displaceable along the insertion direction in relation to the side walls until the mounting position is reached and the printed circuit board additionally latches in the reached end position in the housing, for example. The attachment parts are thus secured in relation to the side walls in the plane extending perpendicularly to the insertion direction; i.e., they are connected to the side walls such that there is a firm connection between the attachment parts and the side walls, but the attachment parts are displaceable along the insertion direction in relation to the side walls until the mounting position is reached. The engagement of the first guide devices with the second guide devices thus creates a guide on the side walls for the combination of attachment parts arranged on the printed circuit board, as a result of which the attachment parts and moreover the printed circuit board can be displaced in a defined manner in relation to the side walls, without the attachment parts being able to readily release from their guided engagement with the side walls.

The guide of the combination of attachment parts on the side walls can be provided, for example, in that each first guide device can be brought into positive-locking engagement with an associated second guide device by establishing an engagement of a web in a groove in the sense of a tongue and groove connection. One of the guide devices thus has a web which engages in an associated groove of the other guide device and thereby provides a guide along the insertion direction, but at the same time interconnects the attachment parts in the plane perpendicular to the insertion direction, such that the engagement between the attachment parts and the side walls is not readily releasable.

In a specific embodiment, the second guide devices of the side walls each have a web, while the first guide devices of each attachment part each have a groove which can be brought into engagement with the web. Each attachment part thus has two grooves which can be brought into engagement with a web of each side wall so that the attachment part is guided in a displaceable manner on both side walls, but a not readily releasable connection is created between the attachment part and the side walls, so that the attachment part is secured in a positive-locking manner in relation to the side walls in a plane extending perpendicularly to the insertion direction.

In an alternative embodiment, it is also conceivable that the first guide devices of the attachment parts each have a web and the second guide devices of the side walls each have a groove, with which a web of an associated first guide device can be brought into engagement.

In another embodiment, it is also conceivable for the guide system to be embodied as an entire or half a dovetail guide with an inclined groove-web system.

The positive connection between the guide devices is in particular such that the attachment parts are secured in relation to the side walls in a plane extending perpendicularly to the insertion direction and a connection is thus created between the attachment parts and the side walls. In order to prevent an attachment part from coming out of engagement with an associated web along a transverse direction which extends transversely to the junction direction and transversely to the insertion direction, a blocking web can be arranged in the region of the groove, which blocking web blocks the web in the groove and prevents the web from slipping out of the groove along the transverse direction. The web can, for example, engage in the groove in an engagement direction pointing along the transverse direction. The blocking web blocks the web from sliding out of the groove counter to the engagement direction and thus ensures the engagement of the web in the groove.

In order to connect the attachment parts firmly to the side walls in a plane extending perpendicularly to the insertion direction (but in a displaceable manner along the insertion direction in relation to the side walls up to the mounting position), the groove preferably encompasses the guide web on four sides. Steps which the guide web forms with the associated side wall are in contact with the blocking web and a boundary section of the groove. The guide web is thus held in engagement in a positive-locking manner with the groove and cannot be moved out of the groove in a plane perpendicular to the insertion direction.

In one embodiment, the attachment parts extend in the mounting position along the junction direction between the side walls. The attachment parts of the combination of attachment parts attached to the printed circuit board can extend, for example, in a planar manner along the junction direction and the insertion direction and can, for example, provide a boundary of the accommodating space to the outside, so that the attachment parts complete the housing and, together with other housing sections, close the accommodating space of the housing to the outside.

When viewed in a plane spanned by the junction direction and the insertion direction, the attachment parts can, for example, each have a body which provides a planar element which, when viewed along the insertion direction, defines the division of the respective attachment part. For example, the body may have a rectangular basic shape (in a plane spanned by the junction direction and the insertion direction) with a division corresponding to the dividing unit or an integral multiple of the dividing unit. A plurality of attachment parts can be arranged next to one another along the insertion direction and adjacent to one another on the printed circuit board, so that the printed circuit board can be populated in a modular manner with different combinations of attachment parts.

In one embodiment, the printed circuit board has side edges which extend along the insertion direction and are opposite one another and on which the attachment parts are to be arranged. A desired combination of attachment parts is thus arranged next to one another on the side edges of the printed circuit board and combined with one another, so that the attachment parts extend along the side edges of the printed circuit board in a state connected to the printed circuit board.

The attachment parts are in this case to be arranged on the printed circuit board in such a way that they protrude from the printed circuit board along the junction direction. While the printed circuit board extends in a planar manner along a plane spanned by the insertion direction and the transverse direction, the attachment parts are arranged on the side edges of the printed circuit board extending along the insertion direction and are perpendicular to the plane of the printed circuit board extending in a planar manner, i.e., along the junction direction, in relation to the printed circuit board.

For mounting the printed circuit board in the housing, the printed circuit board is populated with a combination of attachment parts and is inserted into the housing together with the attachment parts. In this case, it can preferably be provided that the printed circuit board is fixed in the mounting position (exclusively) by means of the attachment parts in the accommodating space of the housing, so that a connection between the printed circuit board and the housing is (only) created indirectly by means of the attachment parts. The printed circuit board is thus secured in the accommodating space of the housing by means of the attachment parts.

In one embodiment, the attachment parts can be connected to the printed circuit board in a positive-locking or force-fitting manner, or also in a firmly bonded manner. For this purpose, the attachment parts can be plugged onto the printed circuit board, for example, so that a firmly bonded (for example, by soldering), force-fitting or positive-locking (for example, latching) connection between the attachment parts and the printed circuit board is established.

For example, for this purpose, some attachment parts can have a latching hook, which is designed to engage in an associated latching opening of the printed circuit board, in order to secure the attachment part to the printed circuit board thereby. For example, for the connection to the printed circuit board, the attachment part can be plugged onto a side edge of the printed circuit board, as a result of which the latching hook snaps in a latching manner into engagement with the associated latching opening of the printed circuit board.

The attachment parts can assume quite different functions and can be designed to be quite different for this purpose.

For example, an attachment part can provide an aperture part for an electrical connection (electrically) connected to the printed circuit board. For this purpose, the attachment part can have, for example, an opening by means of which a plug connector part can be connected to the electrical connection.

In another embodiment, the attachment part can, for example, implement a clamping device which has one or more plug-in openings into which electrical conductors (for example with stripped line ends) or optical conductors (optical waveguides) can be inserted for the purpose of electrical or optical contacting. Such a clamping device can be implemented, for example, as a spring-force clamp or the like. Different clamping devices can have plug-in openings for inserting different electrical conductors with different line cross-sections. Clamping devices of different pole density (i.e., a number of poles per dividing unit corresponding to the number of connections) for connecting different conductors can thus be combined with one another and arranged on the printed circuit board.

However, it is also conceivable and possible for an attachment part to implement a planar wall element (without any further electrical function) for closing the housing to the outside. Such a planar wall element can, for example, provide a closure the housing. Such a planar wall element can also serve as a so-called "spacer" in order to provide a spatial separation between electrical components, for example between electrical connections, and to prevent an electrical interaction between the electrical components (in the sense of an enlargement of a creepage path).

In yet another embodiment, the attachment part can also provide a lattice element, by means of which cooling for an electronic assembly enclosed in the accommodating space can, for example, be provided.

The attachment parts can also provide operating elements, such as switches (for example, DIP switches), regulators (for example, for a potentiometer), indicators, for example in the form of light-emitting diodes or displays, an electrical fuse or also mechanical or electrical functional elements, for example in the form of a screw connection for fastening the housing to another assembly, for example inside a switch-gear cabinet, or also in the form of a shielding support for producing electromagnetic shielding or strain relief for a cable to be secured thereto.

In this case, different attachment parts can have a different coloring which signals an electrotechnical function (such as L/N/PE, EXi, +/−, signal type, safety or the like, which are usually indicated by a specific color code). This has the technical advantage that a subsequent local printing of the housing, as in conventional electronic devices, can be omitted. If a housing of an electronic device is to have a specific coloring or marking in sections, a corresponding attachment part can be used and attached to the housing in order to thus provide a desired coloring or marking.

The electronic device can preferably be combined with other electronic devices by arranging the electronic devices next to one another along the junction direction and fastening them, for example, to a support rail. For this purpose, the electronic device can have a fastening device, for example in the form of a latching device, by means of which the electronic device can be secured to the support rail.

In an embodiment the present invention provides a method for producing an electronic device using a modular system, in which a printed circuit board is inserted along an insertion direction into an accommodating space of a housing and, in a mounting position, is accommodated in the accommodating space. In this case, a combination of attachment parts, each of which, when viewed along the insertion direction, has a division corresponding to a predetermined smallest dividing unit or an integral multiple of the predetermined smallest dividing unit, is connected to the printed circuit board in a manner arranged next to one another along the insertion direction, and the printed circuit board is inserted into the accommodating space of the housing in such a way that first guide devices of the combination of attachment parts are guided in a displaceable manner on a second guide device of the housing the insertion direction.

The advantages and advantageous embodiments described above for the electronic device also apply analogously to the method, so that reference is made to the above statements in this regard.

Figure 2:
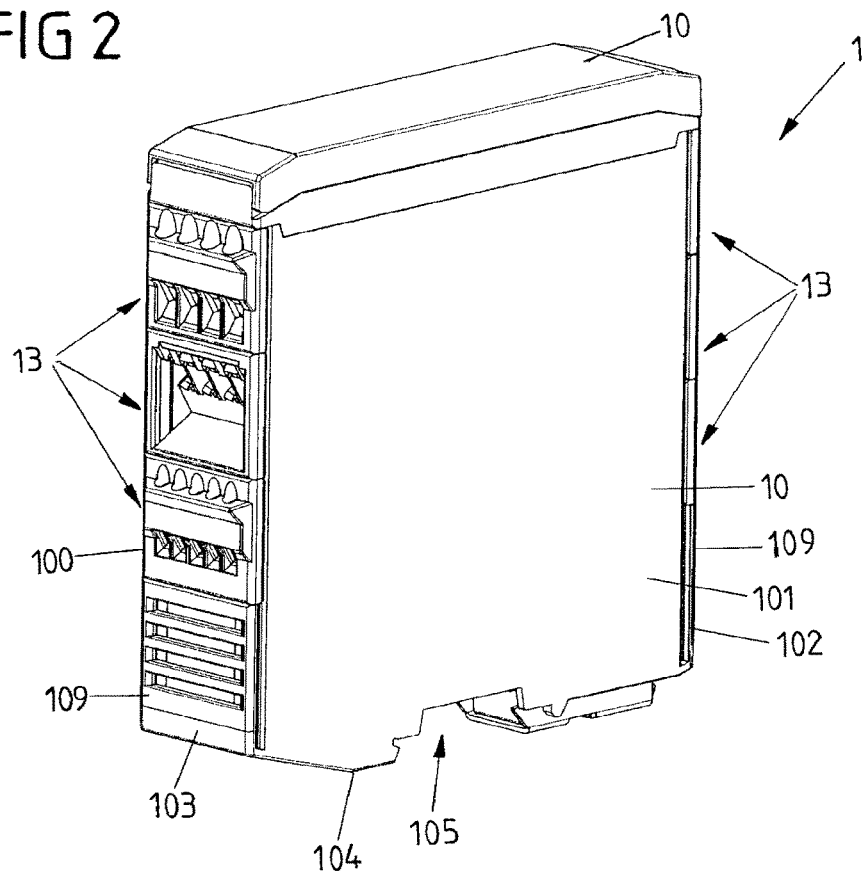
FIG. 2 another perspective view of the electronic device.

FIGS. 1 and 2 show an exemplary embodiment of an electronic device 1 which has a housing 10 and an electronic assembly, enclosed in the housing 10, in the form of a printed circuit board and electronic components arranged thereon. The electronic device 1 can be attached to a support rail 2 by means of a fastening device 105 on a lower side 104 of the housing 10 and can be combined with other electronic devices 1 along a junction direction T in a manner arranged next to one another.

The housing 10 has two side walls 100, 101 which extend perpendicularly to the junction direction T and are spaced apart from one another along the junction direction T as well as end faces 102, 103 which define the substantially cuboidal housing 10. The side walls 100, 101 extend in a planar manner in such a way that other electronic devices 1 can be attached to the electronic device 1 on both sides and can be combined with the electronic device 1 on a support rail 2.

As can be seen from FIGS. 3 to 8, in which different phases in the assembly of the electronic device 1 are shown, the side walls 100, 101 form between them an accommodating space 15, into which a printed circuit board 12 can be inserted in an insertion direction E, such that, in a mounting position, the printed circuit board 12 is accommodated in the accommodating space 15 and extends in parallel to the side walls 100, 101. Different electronic components, for example electronic components in the form of electronic circuits, which form an electronic assembly of the electronic device 1, can be arranged on the printed circuit board 12.

Attachment parts 13 which can have different functions and are mounted together with the printed circuit board 12 on the housing 10 are to be arranged on the printed circuit board 12. The attachment parts 13 are arranged on side edges 121, 122 of the printed circuit board 12 extending along the insertion direction E and, in the connected position, protrude from a surface 120 of the printed circuit board 12 along the junction direction T.

The electronic device 1 can be produced by means of a modular system, within the framework of which a combination of attachment parts 13 selected from a plurality of different attachment parts 13 is arranged on the printed circuit board 12 and the printed circuit board 12 with attachment parts 13 arranged thereon is inserted into the housing 10 in order to in particular provide a desired electrical functionality for the electronic device 1.

As can be seen from FIG. 9, quite different attachment parts 13 can be present and form a modular system, from which a selection can be made in order to variably populate the printed circuit board 12 and to provide quite different functionalities on the electronic device 1. When viewed along the insertion direction E, the attachment parts 13 each have a division X1, X2, X3, X6, X9, which corresponds to a predetermined smallest division unit X1 or an integral multiple of this predetermined smallest division unit X1. This makes it possible to combine different attachment parts 13 with one another in (almost) any manner, in order to provide a desired electrical and/or mechanical function on the printed circuit board 12 and the electronic device 1.

For example, attachment parts 13 in the form of wall elements 13B in the example of FIG. 9 have divisions X1, X2, X3, X6, X9 which differ from one another. A first wall element 13B has, for example, a division X1 corresponding to the predetermined smallest dividing unit X1. In contrast, a second wall element 13B has a division X2 which corresponds to twice the smallest dividing unit X1. Another wall element 13B has a division X3 corresponding to three times the smallest dividing unit X1. Other wall elements 13B have a division X6, X9 corresponding to six or nine times the smallest dividing unit X1.

Likewise, in the example of FIG. 9, the other attachment parts 13 also have a division corresponding to the smallest dividing unit X1 or an integral multiple of the smallest dividing unit X1. In this way, the attachment parts 13 can be variably combined with one another in order to, for example, create a combination of attachment parts 13 with a predetermined overall length, which fits precisely into a housing opening 106 of the housing 10 provided for this purpose, as shown, for example, in FIGS. 1 and 2.

As can be seen from FIGS. 3 to 8, the housing 10 has, on each end face 102, 103, a respective housing opening 106 which, in this exemplary embodiment, has a length (measured along the insertion direction E) of nine times the smallest dividing unit X1. Accordingly, precisely three attachment parts 13 with a division X3 corresponding to three times the dividing unit X1 can, for example, be arranged in each housing opening 106, as can be seen, for example, from FIGS. 1 and 2.

The attachment parts 13 form, for example, aperture parts for connecting devices 14 of the printed circuit board 12 (to the left in FIG. 3) or clamping devices for connecting electrical conductors (to the right in FIG. 3) and are connected to the printed circuit board 12 before inserting the printed circuit board 12 into the accommodating space 15 of the housing 10 so that a pre-assembled structural unit of the printed circuit board 12 with the attachment parts 13 arranged thereon is created, as can be seen, for example, from FIGS. 3 and 5 and 6. The pre-assembled structural unit thus created can then be mounted in the insertion direction E on the housing 10 in that the attachment parts 13 are attached to the side walls 100, 101 of the housing 10 and pushed onto the side walls 100, 101 in the insertion direction E.

The attachment parts 13 each have two first guide devices 133 in the form of a groove, which can be brought into engagement with guide webs 107 on the side edges of the side walls 100, 101, in order to push the attachment parts 13 onto the side walls 100, 101 and thus insert the printed circuit board 12 into the accommodating space 15 of the housing 10.

The accommodating space 15 is formed between the side walls 100, 101 which are spaced apart from one another along the junction direction T and expose housing openings 106 in the region of the end faces 102, 103 above a lower, fixed wall section 109 in each case. As can be seen from FIG. 7, by pushing the attachment parts 13 with the grooves of the guide devices 133 onto the guide webs 107 of the side walls 100, 101, the attachment parts 13 are pushed between the side walls 100, 101 in such a way that the openings 106 in the region of the end faces 102, 103 are closed and the housing 10 is thus closed at its end faces 102, 103 by the lower, fixed wall sections 109 together with the attachment parts 13 as can be seen from FIG. 8.

After inserting the pre-assembled structural unit consisting of the attachment parts 13 and the printed circuit board 12, the housing 10 is closed by a housing cover 11, so that the printed circuit board 12 cannot fall out of the accommodating space 15 and is thus secured in the accommodating space 15. As can be seen from FIG. 8, the housing cover 11 has a body 110 on which lateral webs 111 are formed which latch with connecting webs 108 on the upper edges of the side walls 100, 101 when the housing cover 11 is attached to the housing 10.

In the mounting position, the printed circuit board 12 is enclosed in the accommodating space 15 of the housing 10. The side walls 100, 101 are laterally connected to one another by means of the attachment parts 13, so that the accommodating space 15 of the housing 10 is closed laterally by means of the attachment parts 13.

The attachment parts 13 are attached to the side walls 100, 101 of the housing 10 in a guided manner in that the first guide devices 133 of the attachment parts 13 are brought into positive-locking engagement with the second guide devices 107 of the side walls 100, 101 and the attachment parts 13 are displaced in the insertion direction E in a guided manner in relation to the side walls 100, 101. As can be seen, for example, from the enlarged view of FIG. 4 in conjunction with FIG. 12, the guide devices 133 of the attachment parts 13 are formed by grooves which extend longitudinally along the insertion direction E and provide an engagement between a respectively associated guide web 107 on the side edge of an associated side wall 100, 101, in such a way that a firm connection between the attachment parts 13 and the side walls 101, 101 in a plane perpendicular to the insertion direction E is created, but the attachment parts 13 are displaceable along the insertion direction E in relation to the side walls 100, 101. For this purpose, each guide device 133 has a blocking web 138 which is formed on the rear side of the groove and extends along the insertion direction E and ensures the engagement of an associated guide web 107 in the groove of the guide device 133 such that the guide web 107 cannot come out of engagement with the groove of the guide device 133 along the transverse direction Q.

Figure 12:
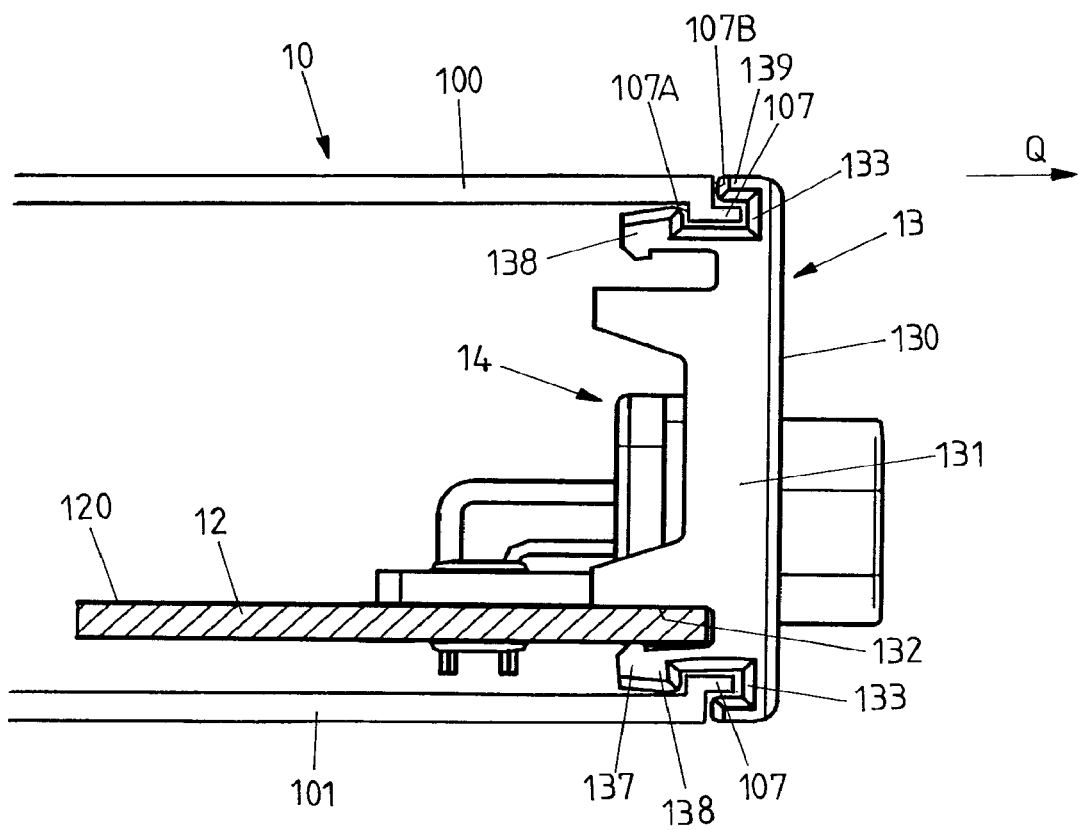
FIG. 12 a view of the printed circuit board with attached attachment part.

Each guide web 107 forms steps 107A, 107B to the associated side wall 100, 101, which steps are in contact with the blocking web 138 and with an outer boundary section 139 of the groove of the guide device 133, so that the guide web 107 is held in a sliding manner in the guide device 133 of the associated attachment part 13 and cannot, when viewed in a plane transverse to the insertion direction E, come out of the emergency, as shown in FIG. 12. Thus, there is a positive-locking engagement for the guide web 107 in the groove of the guide device 133, as a result of which the guide web 107 is held in a positive-locking manner (but in a displaceable manner along the insertion direction E) in the guide device 133.

This embodiment of the guide devices 133 and the guide webs 107 has the effect that the attachment parts 13 can be pushed onto the side walls 100, 101 in a defined manner. This also has the effect that, in the mounting position, a firm connection is established between the attachment parts 13 and the side walls 100, 101, which connection is robust and reliably prevents the (undesired) release of the attachment parts 13 from the side walls 100, 101.

As can be seen, for example, from FIGS. 3 and 4, a plurality of neighboring attachment parts 13 which are adjacent to one another along the insertion direction E are arranged on both sides of the printed circuit board 12 on the side edges 121, 122. The attachment parts 13 each have a body 130 which has a square basic shape (when viewed in a plane spanned by the insertion direction E and the junction direction T), so that different attachment parts 13 can be combined with one another and arranged on the printed circuit board 12 in a modular manner.

The attachment parts 13 are part of a modular system and can be selected in a desired combination, in order to produce an electronic device 1 with intended functionality. In this case, the attachment parts 13 can assume quite different functions and can be designed to be quite different, as shown in an overview illustration in FIG. 9.

Figure 10:
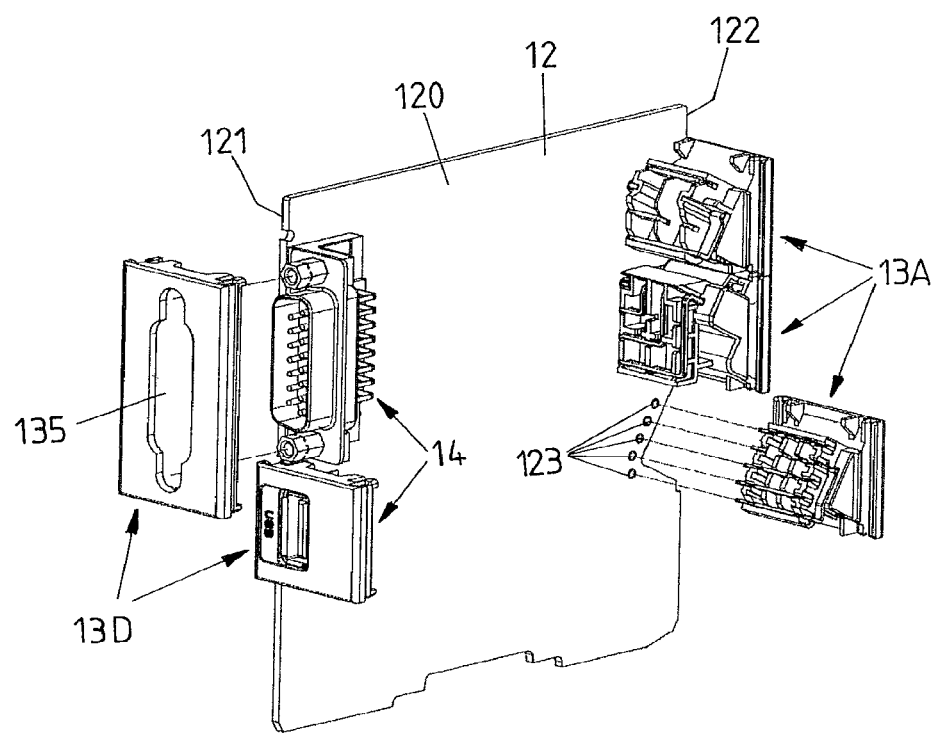
FIG. 10 a view of a printed circuit board with attachment parts arranged thereon.

Attachment parts 13 can thus be designed as clamping devices 13A, which have, for example, a plug-in opening 134, into which electrical conductors (with stripped conductor ends) can be inserted in order to connect the electrical conductors to an associated printed circuit board 12. By means of electrical contact pins 136, the clamping devices 13A can be arranged at contact openings 123 of the printed circuit board 12 (see FIG. 10), in order to electrically and mechanically secure the clamping devices 13A to the printed circuit board 12. The clamping devices 13A can be implemented, for example, as spring-force connections or the like and allow for (simple) connection of electrical conductors.

Different clamping devices 13A can have differently dimensioned plug-in openings 134 for receiving conductors of different line cross-sections, as can be seen from FIG. 9. Thus, the clamping device 13A shown at the top in FIG. 9 and the clamping device 13A shown at the bottom in FIG. 9 have differently dimensioned plug-in openings 134 for inserting conductors with different conductor cross-sections.

In an alternative embodiment, attachment parts 13 may also be designed as wall elements 13B, which provide a planar closure for the housing 10 and may have different sizes.

In yet an alternative embodiment, attachment parts 13 may provide lattice elements 13C, by means of which cooling for an electronic assembly enclosed in the housing 10 may, for example, be provided.

In yet another embodiment, the attachment parts 13 can implement aperture parts 13D, which can be attached to electrical connecting devices 14, for example plug connectors for providing a coaxial connection, a network connection, a USB connection or a parallel or serial interface. The aperture parts 13D have openings 135 by means of which it is possible to connect plug connectors to the connecting devices 14.

Other embodiments of attachment parts 13 are also conceivable. For example, the attachment parts 13 can provide operating elements 13F (for example, switches), indicators 13E (LEDs, displays) or also mechanical functional components 13G, for example with an outward protruding screw flange 16 for fixing the housing 10 to an external structural unit or the like.

The attachment parts 13 are to be arranged on the printed circuit board 12, in order to, in this way, create a pre-assembled structural unit which can be mounted on the housing 10 in order to complete the electronic device 1. In one embodiment, the attachment parts 13 can be connected to the printed circuit board 12, for example, by inserting contact pins 136 into associated contact openings 123 (see FIGS. 9 and 10 on the clamping devices 13A) and soldering them to the printed circuit board 12, for example, so that an electrical and mechanical connection to the printed circuit board 12 is created. In one embodiment, however, it is also conceivable and possible for the attachment parts 13 to be connected to the printed circuit board 12 in a different way, for example in a force-fitting or positive-locking manner.

Figure 11:
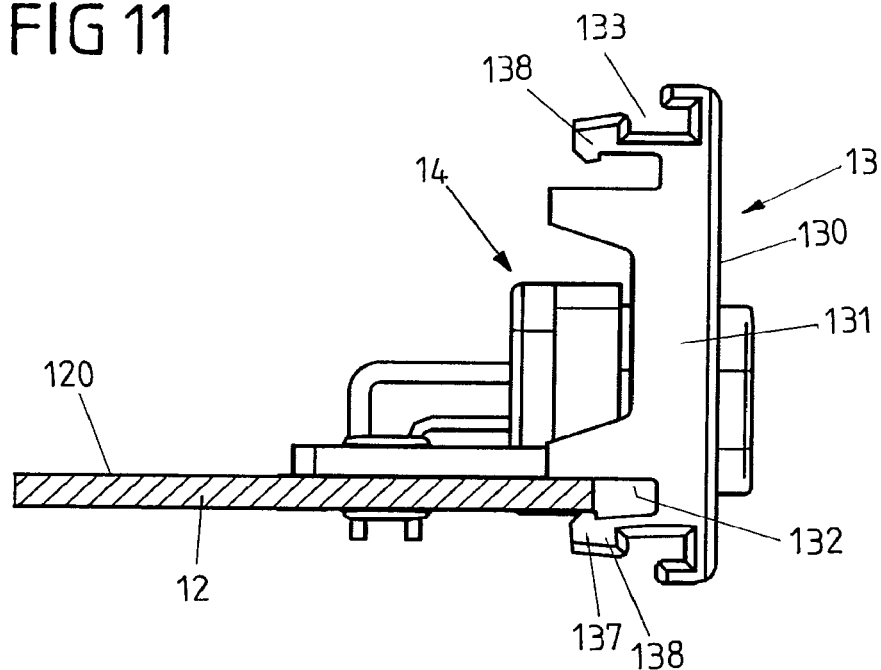
FIG. 11 a view of a printed circuit board when attaching an attachment part to the printed circuit board.

As can be seen from FIGS. 3 and 4 in conjunction with FIGS. 11 to 15, the attachment parts 13 can, for example, have engagement receptacles 132 on webs 131, with which each attachment part 13 can be plugged onto an associated side edge 121, 122 of the printed circuit board 12 as can be seen, for example, from the transition from FIG. 11 to FIG. 12. A fixing lug 137 can in this case be formed on the attachment part 13 and, during attachment, brings about a force-fitting or positive-locking connection.

For example, in the exemplary embodiment of FIGS. 11 and 12, the associated side edge 121, 122 of the printed circuit board 12 is accommodated in a clamping manner in the engagement receptacles 132 in that the fixing lugs 137 of the engagement receptacles 132 press against the printed circuit board 12 (under slight deformation) and thus establish a force closure.

Figure 13:
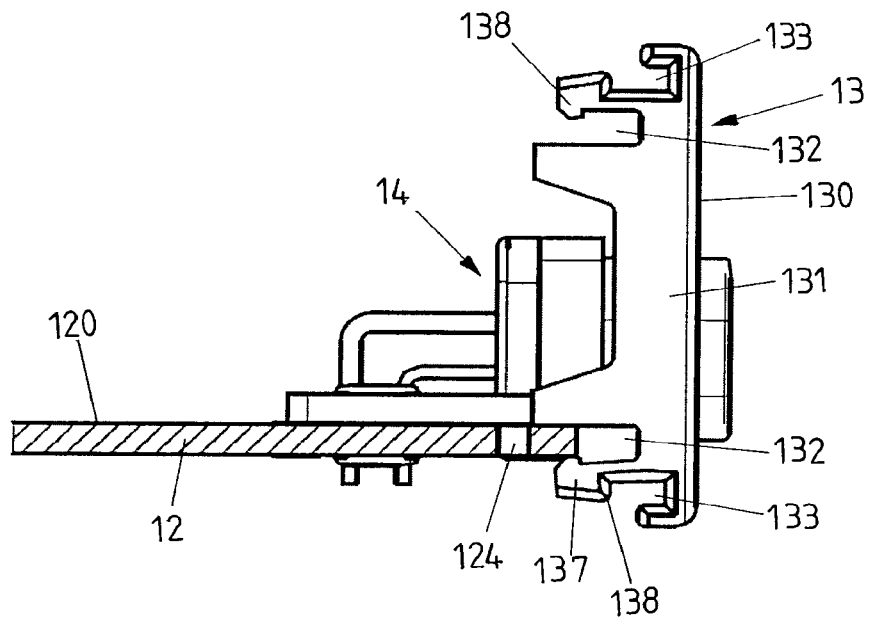
FIG. 13 a sectional view of the printed circuit board when attaching the attachment part.
Figure 14:
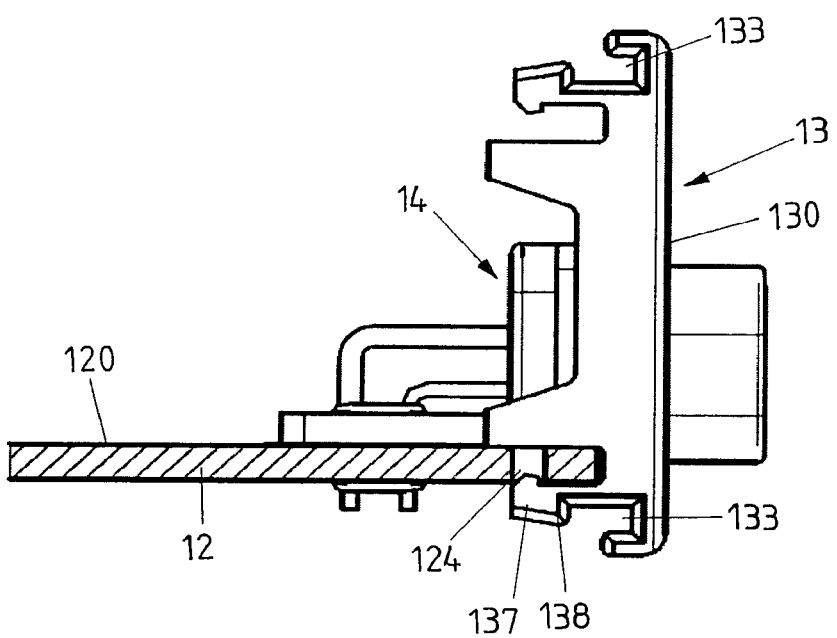
FIG. 14 the sectional view of FIG. 13 with attached attachment part.
Figure 15:
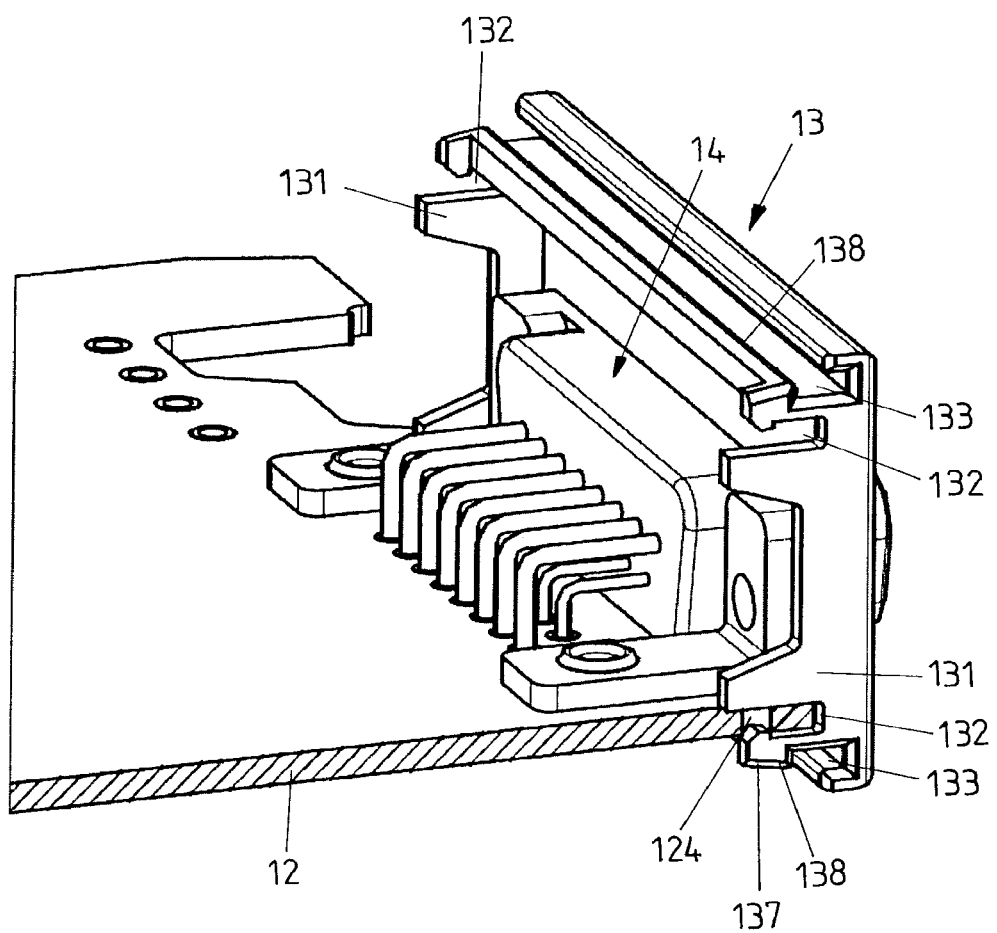
FIG. 15 a perspective, partially sectional view of the printed circuit board, with attached attachment part according to the view of FIG. 14

In contrast, in the exemplary embodiment of FIGS. 13 to 15, the fixing lugs 137 engage in associated latching openings 124 of the printed circuit board 12 after the respective attachment part 13 has been attached to the printed circuit board 12, so that a positive connection is produced, as a result of which the attachment part 13 is held on the printed circuit board 12. Each fixing lug 137 snaps into engagement with an associated latching opening 124 of the printed circuit board 12 when the attachment part 13 is attached to the associated side edge 121, 122 of the printed circuit board 12, so that, in the attached position, a latching, positive connection is created between the attachment part 13 and the printed circuit board 12, as can be seen from the transition from FIG. 13 to FIG. 14 and also in FIG. 15.

The respective attachment part 13 can thus easily be arranged on the printed circuit board 12 and is connected in a force-fitting or positive-locking manner to the printed circuit board 12 in the attached position.

The idea behind the invention is not limited to the exemplary embodiments above, but can also be implemented in a completely different manner.

An electronic device of the type described here can assume quite different functions, for example, controlling electrical machines, evaluating sensor signals, providing a power supply or the like. In doing so, an electronic device of the type described here can be combined with other electrical or electronic assemblies on a support rail, so that a complex electrical system can be created, for example, in a switchgear cabinet.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

Electronic device
10 Housing
100, 101 Side wall
102, 103 End face
104 Underside
105 Fastening device
106 Opening
107 Guide edge
108 Connecting web
109 Wall section
11 Housing cover
110 Body
111 Web
12 Printed circuit board
120 Surface
121, 122 Side edge
123 Contact openings
124 Latching opening
13, 13A-13G Attachment part
130 Body
131 Web
132 Engagement receptacle
133 Guide device
134 Plug-in opening
135 Opening
136 Contact pins
137 Fixing lug
138 Blocking web
139 Boundary web
14 Connecting device
15 Accommodating space
16 Screw flange
2 Support rail
E Insertion direction
Q Transverse direction
T Junction direction
X1, X2, X3, X6, X9 Division

The invention claimed is:

1. A modular system for producing an electronic device, comprising:
 a housing, the housing including two side walls which are spaced apart from one another along a junction direction, the side walls forming an accommodating space between them;
 a printed circuit board which is insertable along an insertion direction into the accommodating space of the housing, the insertion direction being oriented transversely to the junction direction and the printed circuit board such that the printed circuit board is disposed extending perpendicularly to the junction direction in a mounting position in the accommodating space; and
 a plurality of attachment parts disposed next to one another along the insertion direction, which are connectable to the printed circuit board and which, when viewed along the insertion direction, each have a division corresponding to a predetermined smallest dividing unit or an integral multiple of the predetermined smallest dividing unit,
 wherein each attachment part has a first guide device configured to guide on a second guide device of the housing and a combination of attachment parts is connectable to the printed circuit board in a manner arranged next to one another along the insertion direction such that when the printed circuit board is inserted into the accommodating space, the combination of attachment parts is guided in a displaceable manner by the first guide devices on the second guide device of the housing along the insertion direction.

2. The modular system according to claim 1, wherein the attachment parts connect the side walls to one another in a positive-locking manner in the mounting position.

3. The modular system according to claim 1, wherein each attachment part has two first guide devices and each side wall has a second guide device.

4. The modular system according to claim 3, wherein, in order to assemble the housing, the first guide devices and the second guide devices is configured to be brought into engagement with one another such that the combination of attachment parts is firmly connected to the side walls in a plane extending perpendicularly to the insertion direction, but is configured to be displaced along the insertion direction in relation to the side walls.

5. The modular system according to claim 3, wherein each first guide device is configured to be brought into positive-locking engagement with an associated second guide device by engaging a web in a groove.

6. The modular system according to claim 5, wherein the first guide devices each have a blocking web which delimits the groove along a transverse direction extending perpendicularly to the insertion direction and perpendicularly to the junction direction such that the associated web is held in engagement with the groove along the transverse direction.

7. The modular system according to claim 3, wherein the second guide devices each have a web and the first guide devices each have a groove which is configured to be brought into engagement with the web of an associated second guide device.

8. The modular system according to claim 1, wherein, in the mounting position, the attachment parts of the combination of attachment parts extend between the side walls along the junction direction.

9. The modular system according to claim 1, wherein, in the mounting position, the combination of attachment parts forms a boundary for the accommodating space to the outside.

10. The modular system according to claim 1, wherein the at least one attachment part has a body which, when viewed along the insertion direction, defines the division.

11. The modular system according to claim 1, wherein the printed circuit board has opposite side edges extending along the insertion direction, and
 wherein the combination of attachment parts is configured to be connected to the printed circuit board on one of the side edges.

12. The modular system according to claim 1, wherein the printed circuit board is fixed in the mounting position by the combination of attachment parts in the accommodating space of the housing.

13. The modular system according to claim 1, wherein the combination of attachment parts is configured to be connected to the printed circuit board in a firmly bonded, force-fitting, or positive-locking manner.

14. The modular system according to claim 1, wherein the attachment parts form:
   aperture parts for an electrical connection electrically connected to the printed circuit board;
   clamping devices with at least one plug-in opening for connecting an electrical conductor;
   closed, planar wall elements for closing the housing;
   lattice elements; or
   mechanical and/or electrical functional elements.

15. The modular system according to claim 1, further comprising a fastening device configured to connect the electronic device to a support rail.

16. A method for producing an electronic device using a modular system, comprising:
   providing a housing including two side walls which are spaced apart from one another along a junction direction, the side walls forming an accommodating space between them,
   connecting a combination of attachment parts to a printed circuit board with the attachment parts disposed next to one another along an insertion direction, the insertion direction being oriented transversely to the junction direction, the attachment parts extending in the junction direction, such that, when viewed along the insertion direction, each attachment part having a division corresponding to a predetermined smallest dividing unit or an integral multiple of the predetermined smallest dividing unit, each attachment part including first guide devices, each attachment part including first guide devices,
   inserting the printed circuit board along the insertion direction into the accommodating space of the housing such that, in a mounting position, the printed circuit board is disposed extending perpendicularly to the junction direction in the accommodating space, and
   guiding the first guide devices of the combination of attachment parts in a displaceable manner on a second guide device of the housing the insertion direction.

17. A modular system for producing an electronic device, comprising:
   a housing including two side walls which are spaced apart from one another along a junction direction and form an accommodation space between them;
   a printed circuit board which is insertable along an insertion direction into the accommodating space of the housing, the insertion direction being oriented transversely to the junction direction, the printed circuit board being accommodated in the accommodating space in a mounting position extending perpendicularly to the junction direction; and
   a plurality of attachment parts which are connectable to the printed circuit board, each of the attachment parts having a division corresponding to a predetermined smallest dividing unit or an integral multiple of the predetermined smallest dividing unit when the attachment part is viewed along the insertion direction, each attachment part including two first guide devices and each side wall including a second guide device, each first guide device being configured to be brought into positive-locking engagement with an associated second guide device by engaging a web in a groove, the first guide devices each having a blocking web which delimits the groove along a transverse direction extending perpendicularly to the insertion direction and perpendicularly to the junction direction such that the associated web is held in engagement with the groove along the transverse direction; and
   wherein each attachment part has a first guide device configured to guide on a second guide device of the housing and a combination of attachment parts is connectable to the printed circuit board in a manner arranged next to one another along the insertion direction such that when the printed circuit board is inserted into the accommodating space, the combination of attachment parts is guided in a displaceable manner by the first guide devices on the second guide device of the housing along the insertion direction.

* * * * *